(12) United States Patent
Akram

(10) Patent No.: US 6,339,256 B2
(45) Date of Patent: *Jan. 15, 2002

(54) DEVICE AND METHOD FOR ELECTRICALLY OR THERMALLY COUPLING TO THE BACKSIDES OF INTEGRATED CIRCUIT DICE IN CHIP-ON-BOARD APPLICATIONS

(75) Inventor: Salman Akram, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/225,278

(22) Filed: Jan. 5, 1999

Related U.S. Application Data

(62) Division of application No. 08/870,614, filed on Jun. 6, 1997.

(51) Int. Cl.[7] ............................................. H01L 23/52
(52) U.S. Cl. .................... 257/691; 257/680; 257/700; 257/720
(58) Field of Search ................................ 257/723, 700, 257/758, 782, 686, 698, 703, 706, 712, 774; 361/780, 790, 794, 736, 761, 707, 711, 717, 718, 719

(56) References Cited

U.S. PATENT DOCUMENTS

| | | | |
|---|---|---|---|
| 4,038,488 A | * | 7/1977 | Lin ............................ 174/52 |
| 4,283,755 A | | 8/1981 | Tracy |
| 4,578,697 A | | 3/1986 | Takemae |
| 4,729,061 A | | 3/1988 | Brown |
| 4,903,114 A | | 2/1990 | Aoki et al. |
| 4,992,850 A | * | 2/1991 | Corbett et al. ................. 357/72 |
| 5,138,436 A | | 8/1992 | Koepf |
| 5,311,396 A | | 5/1994 | Steffen |
| 5,397,917 A | * | 3/1995 | Ommen et al. ............. 257/698 |
| 5,436,203 A | * | 7/1995 | Lin ............................. 437/209 |
| 5,467,253 A | * | 11/1995 | Heckman .................... 361/761 |
| 5,497,027 A | | 3/1996 | Crafts |
| 5,672,911 A | * | 9/1997 | Patil et al. ................... 257/691 |
| 5,677,203 A | * | 10/1997 | Rates ............................. 437/8 |
| 5,701,032 A | * | 12/1997 | Ficher et al. ................ 257/692 |
| 5,768,109 A | | 6/1998 | Gulick et al. |
| 5,773,195 A | * | 6/1998 | Kamperman et al. ........ 430/312 |
| 5,844,168 A | * | 12/1998 | Schueller .................... 174/52.4 |
| 5,938,956 A | * | 8/1999 | Hembree et al. ........... 219/209 |

* cited by examiner

Primary Examiner—Mary Wilczewski
Assistant Examiner—David Goodwin
(74) Attorney, Agent, or Firm—TraskBritt

(57) ABSTRACT

An inventive printed circuit board for chip-on-board applications has a ground plane that is externally exposed through apertures in any overlying layers in the board so the backside surface of a bare integrated circuit die can be directly attached to the ground plane using a silver-filled epoxy. As a result, heat is conducted away from the die through the ground plane. Also, a substrate bias voltage can be supplied to the backside surface of the die through the ground plane to eliminate the need for an internal substrate bias to the die, and to eliminate the need for a substrate bias voltage bond pad on the front-side surface of the die.

42 Claims, 5 Drawing Sheets

DEVICE AND METHOD FOR ELECTRICALLY OR THERMALLY COUPLING TO THE BACKSIDES OF INTEGRATED CIRCUIT DICE IN CHIP-ON-BOARD APPLICATIONS

CROSS REFERENCE TO RELATED APPLICATON

This application is a divisional of application Ser. No. 08/870,614, filed Jun. 6, 1997, pending.

BACKGROUND OF THE INVENTION

1. Field of the Invention

This invention relates in general to chip-on-board applications for integrated circuit dice, and in particular to devices and methods for electrically and thermally coupling to the backsides of dice in such applications.

2. State of the Art

Integrated circuit (IC) dice or "chips" are small, generally rectangular IC devices cut from semiconductor wafers, such as silicon wafers, on which multiple IC's have been fabricated. Most dice are packaged by attaching them to lead frames supported in plastic or ceramic packages, and the lead frames and packages are typically designed to conduct heat away from the dice in order to protect them from heat damage. Such packages are also typically designed to protect the dice from corrosion.

Some dice, however, are packaged in what are known as "chip-on-board" (COB) applications, in which the dice are directly attached to printed circuit boards (PCB's) or other known substrates using well-known die-attach techniques. In these applications, bond pads on one or more dice are connected to signal traces on the surfaces of PCB's or other substrates using wire, or tape-automated, bonding, and a liquid or gel encapsulant, commonly referred to as a "glob top," is applied over the dice to protect them from corrosion. One such COB application is described in U.S. Pat. No. 5,497,027.

Dice in COB applications typically generate more heat than their associated PCB's alone can satisfactorily conduct away. Consequently, certain techniques have been devised to assist in conducting heat away from dice in COB applications. In one such technique shown in FIG. 1, circuit traces 10 that widen near a die 12 and are directly attached to the surface 14 of a PCB 16 assist the PCB 16 in conducting significant amounts of heat away from the die 12. Unfortunately, circuit traces that widen sufficiently near dice to satisfactorily conduct heat away from the dice typically use an inordinately large amount of surface space on their associated PCB's. As a result, widened circuit traces can be difficult or impossible to implement in today's densely packed COB applications. Widened circuit traces can also lead to an undesirable increase in capacitive and inductive parasitics, which are highly undesirable for high-speed applications.

Another technique for conducting heat away from dice in COB applications involves using thermally conductive PCB's in place of the more commonly used glass-epoxy PCB's. Thermally conductive PCB's are made with materials such as insulated aluminum, porcelainized steel, and ceramics that are superior in heat transfer characteristics to glass-epoxy. Because this technique is not applicable to the glass-epoxy PCB's used in the majority of COB applications, it is of limited utility.

Therefore, there is a need in the art for a device and method for satisfactorily conducting heat away from dice that are directly attached to a variety of PCB's, including conventional, widely-utilized glass-epoxy PCB's, without degrading the electrical characteristics of the interconnecting circuitry in COB applications.

BRIEF SUMMARY OF THE INVENTION

An inventive device for chip-on-board applications comprises a base, such as a printed circuit board (PCB) or a multi-chip module, that includes a conductive layer, such as a copper or other metallic plane, positioned on a surface of a supporting insulative substrate. An insulating layer overlies the surface of the conductive layer and defines at least one aperture in substantial registry with a localized region on the conductive layer on which a bare integrated circuit die is to be placed. The backside surface of the die is directly attached to the conductive plane in the localized region using a conductive die-attach material, such as a silver-filled epoxy, interposed between the conductive layer and the die. The inventive device thus can advantageously conduct heat away from the die by directly coupling the backside of the die to the conductive layer through the conductive die-attach material. The device can also conduct a substrate bias voltage to the backside of the die through the conductive layer and the die-attach material.

In a modified version of the base described above, the base includes multiple vertically-separated conductive layers, each layer having a localized region for conductive attachment to one of multiple bare integrated circuit dice. As a result, each of the dice may receive a different substrate bias voltage through its respective conductive layer.

In another embodiment of the present invention, an electronic device includes the base described above and an integrated circuit die, such as a Dynamic Random Access Memory (DRAM) die. In still another embodiment, an electronic system includes input, output, memory, and processor devices, and one or more of these devices includes the base described above.

In a further embodiment, a system for conducting heat away from a die includes a thermally conductive interior PCB layer having a surface with an externally accessible die-attach region. A thermally conductive die-attach material directly attaches a backside surface of the die to the die-attach region to establish thermal conduction between the die and the thermally conductive layer.

In a still further embodiment of the present invention, a system for supplying a substrate bias voltage to a die includes a substrate bias voltage generator and an electrically conductive layer inside a PCB for conducting the substrate bias voltage to an externally accessible die-attach region on the surface of the conductive layer. An electrically conductive die-attach material directly attaches a backside surface of the die to the die-attach region to conduct the substrate bias voltage to the backside surface of the die.

DETAILED DESCRIPTION OF THE INVENTION

Figure 1:
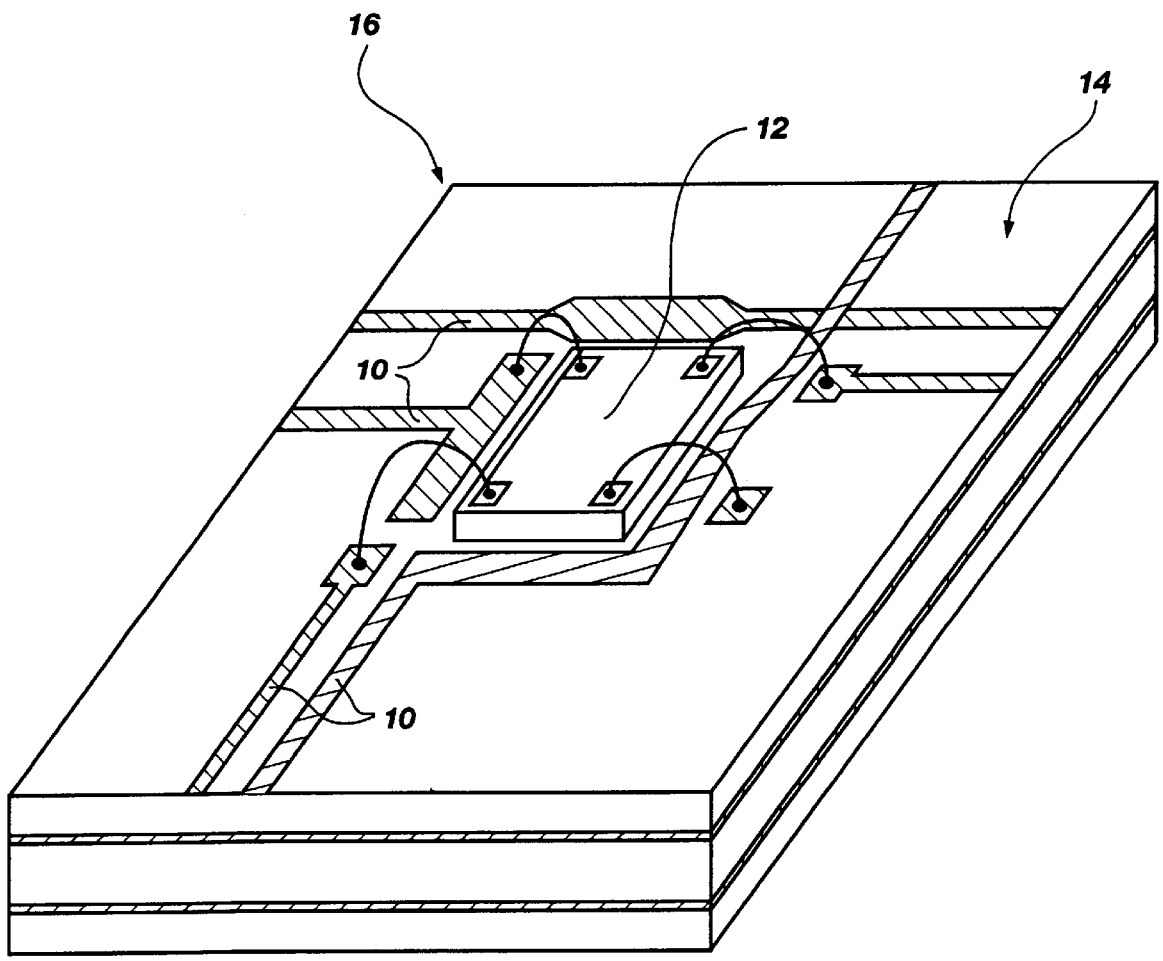
FIG. 1 is an isometric view of a portion of a prior art printed circuit board that uses widened circuit traces near a directly attached (i.e., "on-board") integrated circuit die to conduct heat away from the die.
Figure 2:
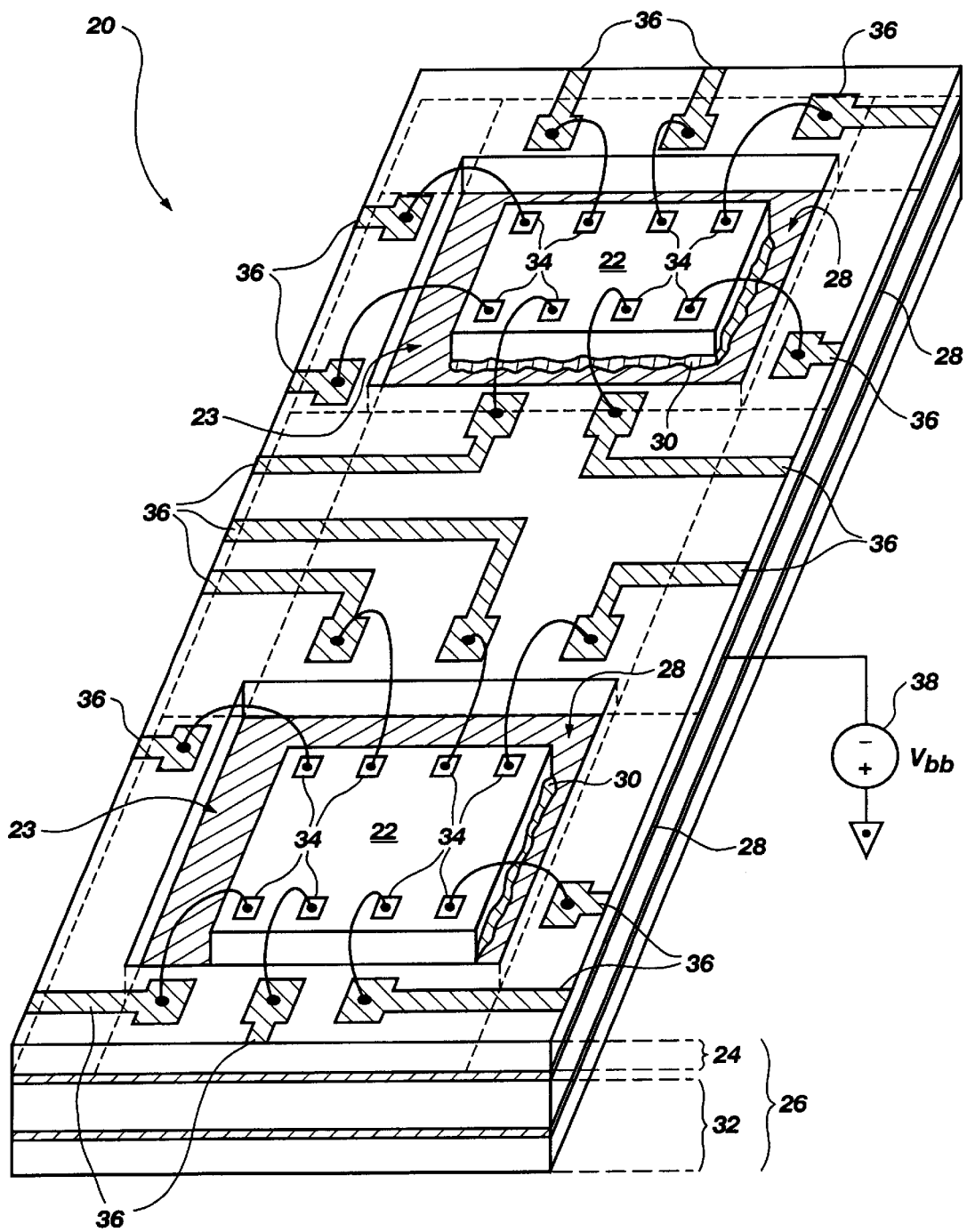
FIG. 2 is an isometric view of a portion of a multi-chip module including integrated circuit dice directly attached at their backsides to a conductive layer of a base, such as a printed circuit board, in order to effect direct electrical and thermal conduction between the conductive layer and the dice in accordance with the present invention.

As shown in FIG. 2, the present invention comprises a multi-chip module 20 that includes a plurality of integrated circuit dice 22, each recessed in an aperture 23 in an insulating layer 24 of an insulative base 26. The base 26 may comprise an FR-4 glass-epoxy printed circuit board (PCB) or other PCB, the term PCB as employed herein including conductor-carrying substrates of silicon, ceramic, polymers and other materials known in the art. Although the present invention will be described with respect to multi-chip module embodiments, it will be understood by those having skill in the field of this invention that the present invention is also applicable to single-die applications employing PCB's or other conductor-carrying bases. It will also be understood that the present invention is applicable to memory dice, such as Dynamic Random Access Memory (DRAM) dice, packaged in Single In-line Memory Modules (SIMM's), Dual In-line Memory Modules (DIMM's), and memory cards, as well as to processors and other dice commonly employed singly and in multi-chip assemblies on a variety of conductor-carrying substrates.

Backsides (not shown) of the dice 22 are directly attached in a chip-on-board (COB) application to a conductive layer 28 of the base 26 using a conductive die-attach material 30, such as a eutectic solder (e.g., a gold/silver eutectic), a metal-filled epoxy (e.g., a silver-filled epoxy), or a conductive polyamide adhesive. Also, the conductive layer 28 is positioned on a substrate 32 that may comprise one or more PCB layers. It will be understood that the conductive die-attach material and the conductive layer may be thermally conductive, electrically conductive, or preferably both, and that the conductive layer may comprise a wide variety of conductive materials, including copper, gold, and platinum. It should also be understood that there may be more than one vertically-superimposed conductive layer in a base and, consequently, that different dice may be attached to different conductive layers in the same base through apertures 23 extending to different depths of base 26.

Bond pads 34 on front- or active-side surfaces of the dice 22 are wire-bonded to signal traces 36 carried on a surface of the insulating layer 24. Of course, the bond pads 34 may also be bonded to the signal traces 36 using tape-automated bonding (TAB) techniques, wherein the conductors are carried on a flexible dielectric film. Also, the signal traces 36 may comprise a wide variety of conductors, including, without limitation, copper, gold, and platinum. Further, it should be understood that, while the multi-chip module 20 of FIG. 2 is shown as having a single insulating layer 24 between the conductive layer 28 and the signal traces 36, the present invention is equally applicable to COB applications in which there are multiple superimposed layers, such as insulating, conductive, or signal layers, between a conductive layer to which the backside of a die is directly attached and the signal layer to which the front-side of each die is bonded.

Because the present invention directly attaches the backsides of dice to a conductive layer, heat from the dice is advantageously conducted away from the dice through the conductive layer. Also, as shown in FIG. 2, a substrate bias voltage generator 38 can supply a substrate bias voltage $V_{bb}$ to the backsides (not shown) of the dice 22 through the conductive layer 28. As a result, there is no need for on-board substrate bias voltage generators (not shown) in the dice 22, and there is no need to supply the substrate bias voltage $V_{bb}$ to the dice 22 through bond pads 34 on their front-side surfaces. Of course, a supply voltage (commonly designated $V_{cc}$), ground potential (commonly designated $V_{ss}$), or electronic signal may be supplied to the dice 22 through the conductive layer 28 in place of the substrate bias voltage $V_{bb}$. Also, although the generator 38 is shown in FIG. 2 as applying a negative substrate bias voltage $V_{bb}$ to the conductive layer 28, it should be understood that the generator 38 may instead provide a positive substrate bias voltage $V_{bb}$ to the layer 28.

The present invention also provides marginally greater physical protection for dice by positioning them within a protective aperture in the thin upper insulating layer 24. Further, the present invention advantageously allows incrementally shorter bond wires to be used during die-bond because the front-side surfaces of the dice are slightly closer to the level of the signal traces to which they are bonded. While such advantages are relatively small, they are nonetheless significant.

Figure 3:
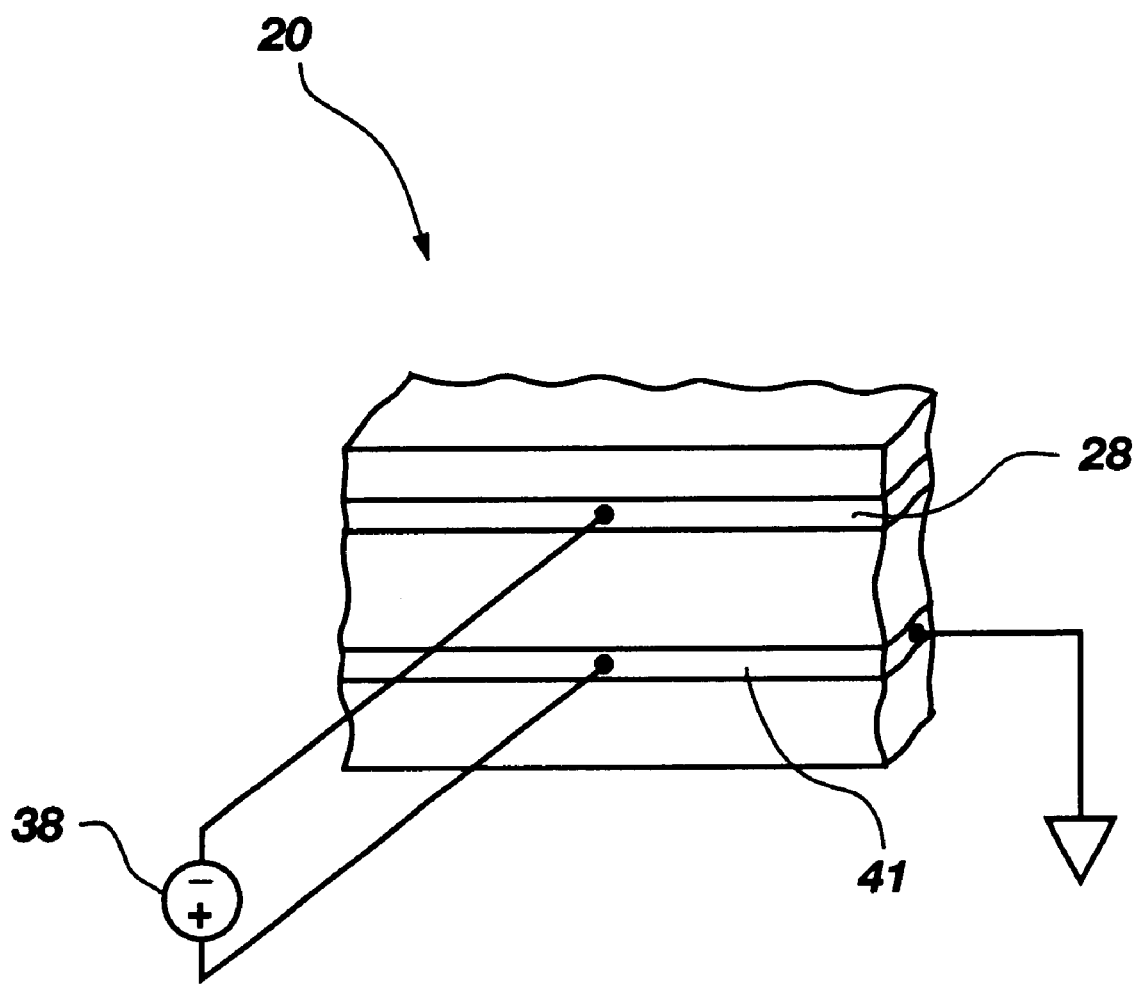
FIG. 3 is an isometric sectional view of the multi-chip module portion of FIG. 2 with an alternative substrate biasing arrangement.

As shown in a sectional view in FIG. 3, an alternative version of the multi-chip module 20 of FIG. 2 includes the substrate bias voltage generator 38 directly applying a bias between the conductive layer 28 and a conductive reference layer 41. Of course, while the reference layer 41 is shown in FIG. 3 as being grounded, it may be coupled to any voltage, particularly other reference voltages.

Figure 4:
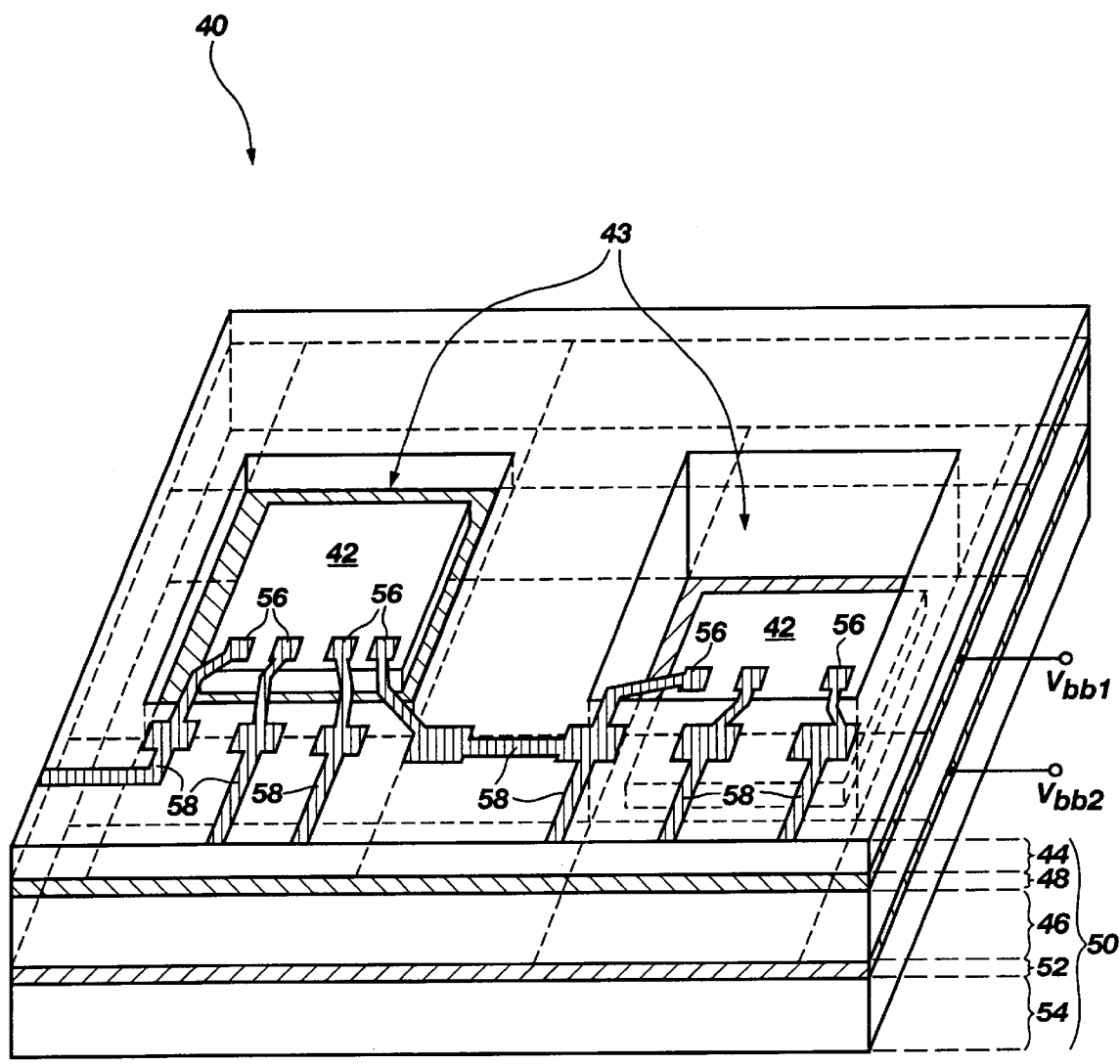
FIG. 4 is an isometric view of a portion of a multi-chip module including integrated circuit dice directly attached at their backsides to multiple conductive layers of a base, such as a printed circuit board, in order to effect direct electrical and thermal conduction between each die and one of the conductive layers in accordance with the present invention.

As shown in FIG. 4, the present invention also comprises a multi-chip module 40 that includes a plurality of integrated circuit dice 42, each recessed in an aperture 43 in insulating layers 44 and 46 and a first conductive layer 48 of an insulative base 50. The base 50 may comprise an FR-4 glass-epoxy printed circuit board (PCB) or other PCB.

Backsides (not shown) of the dice 42 are directly respectively attached in a chip-on-board (COB) application to the first conductive layer 48 and a second conductive layer 52 of the base 50 using a conductive die-attach material (not shown), such as a eutectic solder (e.g., a gold/silver eutectic), a metal-filled epoxy (e.g., a silver-filled epoxy), or a conductive polyamide adhesive. Also, the second conductive layer 52 is positioned on a substrate 54 that may comprise one or more PCB layers. It will be understood that the conductive die-attach material and the conductive layers may be thermally conductive, electrically conductive, or preferably both, and that the conductive layers may comprise a wide variety of conductive materials, including copper, gold, and platinum.

Bond pads 56 on front- or active-side surfaces of the dice 42 are Tape-Automated Bonded (TAB) to signal traces 58 carried on a surface of the insulating layer 44. Of course, the signal traces may comprise a wide variety of conductors, including, without limitation, copper, gold, and platinum. The flexible film (usually polyimide) of the TAB tape has been deleted for clarity.

Because the present invention directly attaches the backsides of dice to conductive layers, heat from the dice is advantageously conducted away from the dice through the conductive layers. Also, substrate bias voltage generators (not shown) can supply a first substrate bias voltage $V_{bb1}$ to the backside (not shown) of one of the dice 42 through the first conductive layer 48 and a second substrate bias voltage $V_{bb2}$ to the backside (not shown) of the other of the dice 42 through the second conductive layer 52. As a result, there is no need for on-board substrate bias voltage generators in the dice 42, and there is no need to supply the substrate bias voltages $V_{bb1}$ and $V_{bb2}$ to the dice 42 through bond pads 56 on their front-side surfaces. Of course, a supply voltage $V_{cc}$, ground potential $V_{ss}$, or electronic signal may be supplied to the dice 42 through the conductive layers 48 and 52 in place of the substrate bias voltages $V_{bb1}$ and $V_{bb2}$. Also, the substrate bias voltages $V_{bb1}$ and $V_{bb2}$ can be different voltages.

Figure 5:
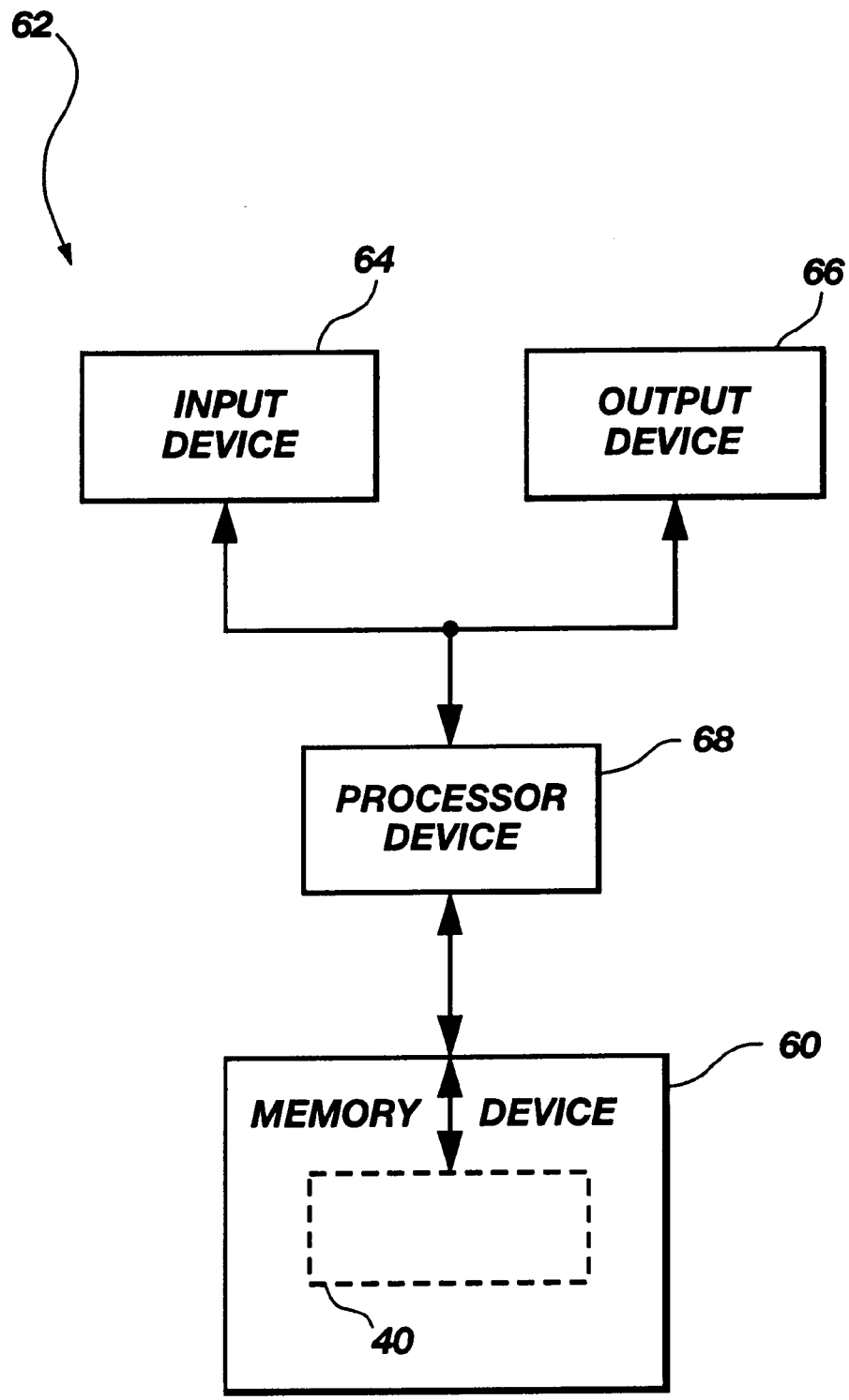
FIG. 5 is a block diagram of an electronic system including the multi-chip module of FIG. 4.

As shown in FIG. 5, the multi-chip module 40 of FIG. 4 can be incorporated into a memory device 60 of an electronic system 62, such as a computer system, that includes an input device 64 and an output device 66 coupled to a processor device 68. Of course, the multi-chip module 40 can alternatively be incorporated into the input device 64, the output device 66, or the processor device 68. Alternatively, the multi-chip module (not shown) of FIG. 2 may be incorporated into the input device 64, output device 66, processor device 68, or memory device 60. Also, the memory device 60 of FIG. 5 may comprise a DIMM, SIMM, memory card or any other memory die-carrying substrate.

Although the present invention has been described with reference to particular embodiments, the invention is not limited to these described embodiments. Rather, the invention is limited only by the appended claims, which include within their scope all equivalent devices or methods which operate according to the principles of the invention as described.

What is claimed is:

1. A printed circuit board for chip-on-board applications, the printed circuit board comprising:

a first dielectric layer including a top surface;

a first conductive layer positioned adjacently above the top surface of the first dielectric layer and including an upwardly facing die-mounting surface within a chip-attach area of the first conductive layer for direct conductive attachment to a backside surface of a bare integrated circuit chip to establish at least one of electrical and thermal conduction between the top surface of the first conductive layer and a bare integrated circuit chip;

a second dielectric layer positioned adjacently above the upwardly facing die-mounting surface of the first conductive layer, the second dielectric layer having an aperture therein to further define the chip-attach area of the first conductive layer and to receive a bare integrated circuit chip;

a second conductive layer positioned adjacently below the first dielectric layer, the second conductive layer extending laterally underneath at least the chip-attach area of the first conductive layer, the second conductive layer vertically insulated from direct electrical communication with the first conductive layer;

an insulative substrate positioned adjacently below the second conductive layer; and a layer of signal traces superimposed on the second dielectric layer in a substantially parallel relationship therewith, at least some of the signal traces of the layer of signal traces including bond pads for electrical connection to a front-side surface of a bare integrated circuit chip.

2. The printed circuit board of claim 1, wherein the layer of signal traces is positioned on a top surface of the second dielectric layer.

3. The printed circuit board of claim 1, wherein a portion of the aperture of the second dielectric layer extends generally about a periphery of the chip-attach area of the first conductive layer.

4. The printed circuit board of claim 1, wherein the signal traces are selected from a group comprising copper, gold, and platinum.

5. A multi-chip module comprising:

a first supporting substrate including an insulative surface;

a first conductive layer positioned adjacently above the insulative surface of the first supporting substrate and including a top surface with a plurality of localized die-attach areas thereon;

a plurality of bare integrated circuit dice, each associated with one of the plurality of die-attach areas, each of the plurality of bare integrated circuit dice including opposing front-side and backside surfaces, the front-side surface of each of the plurality of bare integrated circuit dice including a plurality of bond pads thereon;

a conductive die-attach material interposed between each of the bare integrated circuit dice and each associated localized die-attach area for directly attaching the backside surface of each die to its associated localized die-attach area to establish at least one of electrical and thermal conduction between each die and each of the localized die-attach areas of the top surface of the first conductive layer;

an insulating layer positioned adjacently above the top surface of the first conductive layer, the insulating layer having a plurality of apertures therein, each aperture in substantial registry with one of the attached bare integrated circuit dice;

a second conductive layer positioned adjacently below the first supporting substrate, the second conductive layer extending laterally underneath at least the plurality of localized die-attach areas of the first conductive layer, the second conductive layer vertically insulated from direct electrical communication with the first conductive layer by the first supporting substrate;

a second, insulative supporting substrate positioned adjacently below the second conductive layer;

a signal layer connected to the insulating layer in a substantially parallel relationship therewith, the signal layer having a plurality of conductor-devoid areas therein, each conductor-devoid area in substantial registry with one of the attached bare integrated circuit dice, the signal layer including a plurality of terminals; and a plurality of conductors coupling the plurality of terminals of the signal layer to the plurality of bond pads on the front-side surfaces of the bare integrated circuit dice.

6. The multi-chip module of claim 5, wherein the signal layer comprises a plurality of signal traces.

7. The multi-chip module of claim 5, wherein the plurality of signal layer terminals comprises bond pads.

8. The multi-chip module of claim 5, wherein at least one of the bare integrated circuit dice comprises a dynamic random access memory die.

9. The multi-chip module of claim 5, wherein the conductive die-attach material comprises a conductive epoxy.

10. The multi-chip module of claim 9, wherein the conductive epoxy comprises a metal filled epoxy.

11. The multi-chip module of claim 10, wherein the metal filled epoxy comprises a silver filled epoxy.

12. The multi-chip module of claim 5, wherein the conductive die-attach material comprises a eutectic material.

13. The multi-chip module of claim 12, wherein the eutectic material comprises a gold and silver eutectic material.

14. The multi-chip module of claim 5, wherein the conductive die-attach material comprises a solder.

15. The multi-chip module of claim 5, wherein the conductive die-attach material comprises a conductive polyamide.

16. The multi-chip module of claim 5, wherein the conductive die-attach material comprises a thermally conductive die-attach material.

17. The multi-chip module of claim 5, wherein the plurality of conductors comprises wire bond conductors.

18. The multi-chip module of claim 5, wherein the plurality of conductors comprises TAB conductors.

19. An electronic device comprising:
   a first supporting substrate including an insulative surface;
   a first conductive layer positioned adjacently above the insulative surface of the first supporting substrate and including a top surface with a localized die-attach area thereon;
   a bare integrated circuit die having opposing front-side and backside surfaces, the front-side surface having a plurality of bond pads thereon;
   a conductive die-attach material for directly attaching the backside surface of the bare integrated circuit die to the localized die-attach area on the surface of the first conductive layer to establish at least one of electrical and thermal conduction between the backside surface of the bare integrated circuit die and the localized die attach area on the top surface of the first conductive layer;
   an insulating layer positioned adjacently above the top surface of the first conductive layer, the insulating layer having an aperture therein in substantial registry with the attached bare integrated circuit die;
   a second conductive layer positioned adjacently below the first supporting substrate, the second conductive layer extending laterally underneath at least the localized die-attach area of the first conductive layer, the second conductive layer vertically insulated from direct electrical communication with the first conductive layer;
   a second supporting substrate positioned adjacently below the second conductive layer;
   a signal layer connected to the insulating layer in a substantially parallel relationship therewith, the signal layer having an aperture therein in substantial registry with the attached bare integrated circuit die, the signal layer including a plurality of terminals; and
   a plurality of conductors coupling the plurality of terminals of the signal layer to the plurality of bond pads on the front-side surface of the bare integrated circuit die.

20. The electronic device of claim 19, wherein the signal layer comprises a plurality of signal traces.

21. The electronic device of claim 19, wherein the plurality of signal layer terminals comprises bond pads.

22. The electronic device of claim 19, wherein the bare integrated circuit die comprises a dynamic random access memory die.

23. The electronic device of claim 19, wherein the conductive die-attach material comprises a conductive epoxy.

24. The electronic device of claim 23, wherein the conductive epoxy comprises a metal-filled epoxy.

25. The electronic device of claim 24, wherein the metal-filled epoxy comprises a silver-filled epoxy.

26. The electronic device of claim 19, wherein the conductive die-attach material comprises a thermally conductive die-attach material.

27. The electronic device of claim 19, wherein the plurality of conductors comprises wire bond conductors.

28. The electronic device of claim 19, wherein the plurality of conductors comprises tape-automated-bonding conductors.

29. A system for conducting heat away from a bare integrated circuit die, the system comprising:
   a first dielectric layer;
   a first thermally conductive layer positioned adjacently above the first dielectric layer, the first thermally conductive layer positioned internally in a printed circuit board, the first thermally conductive layer including a top surface with an externally accessible localized die-attach region;
   a second dielectric layer having an aperture in substantial registry with the externally accessible localized die-attach region of the first thermally conductive layer, the second dielectric layer positioned adjacently above the first thermally conductive layer;
   a second thermally conductive layer positioned adjacently below the first dielectric layer, the second thermally conductive layer extending laterally underneath at least the externally accessible localized die-attach region of the first thermally conductive layer, the second thermally conductive layer vertically insulated from direct electrical communication with the first thermally conductive layer; and
   a thermally conductive die-attach material for directly attaching a backside surface of a bare integrated circuit die to the externally accessible localized die-attach region on the top surface of the first thermally conductive layer to establish thermal conduction between the bare integrated circuit die and the first thermally conductive layer.

30. The system of claim 29, wherein the first thermally conductive layer comprises a substantially continuous thermally conductive sheet.

31. The system of claim 29, wherein the first thermally conductive layer is also electrically conductive.

32. A system for supplying a substrate bias voltage to a bare integrated circuit die, the system comprising:
   a substrate bias voltage generator for supplying a substrate bias voltage;
   a first electrically conductive layer positioned within a printed circuit board and coupled to the substrate bias voltage generator, the first electrically conductive layer including a top surface with an externally accessible localized die-attach region;
   a second electrically conductive layer positioned within a printed circuit board and coupled to the substrate bias voltage generator, the second electrically conductive layer positioned below and extending laterally underneath at least the externally accessible localized die-attach region of the first electrically conductive layer, the second electrically conductive layer vertically insulated from direct electrical communication with the first electrically conductive layer; and
   an electrically conductive die-attach material for directly attaching a backside surface of a bare integrated circuit die to the externally accessible localized die-attach region on the top surface of the first electrically conductive layer to conduct the substrate bias voltage from the first electrically conductive layer to the backside surface of the bare integrated circuit die.

33. The system of claim 32, wherein the electrically conductive die-attach material comprises a conductive epoxy.

34. The system of claim 33, wherein the conductive epoxy comprises a metal-filled epoxy.

35. The system of claim 34, wherein the metal-filled epoxy comprises a silver-filled epoxy.

36. The system of claim 32, wherein the electrically conductive die-attach material comprises a eutectic material.

37. The system of claim 36, wherein the eutectic material comprises a gold and silver eutectic material.

38. The system of claim 32, wherein the electrically conductive die-attach material comprises a solder.

39. The system of claim 32, wherein the electrically conductive die-attach material comprises a conductive polyamide.

40. The system of claim 32, wherein the electrically conductive die-attach material is also a thermally conductive die-attach material.

41. The system of claim 32, wherein the first electrically conductive layer comprises a substantially continuous electrically conductive sheet.

42. A system for supplying a substrate bias voltage to a bare integrated circuit die, the system consisting essentially of:

a substrate bias voltage generator for supplying the substrate bias voltage;

a first electrically conductive layer positioned internally in a printed circuit board and coupled to the substrate bias voltage generator, the first electrically conductive layer including a top surface with an externally accessible localized die-attach region;

a second electrically conductive layer positioned within a printed circuit board and coupled to the substrate bias voltage generator, the second electrically conductive layer positioned below and extending laterally underneath at least the externally accessible localized die-attach region of the first conductive layer, the second conductive layer vertically insulated from direct electrical communication with the first electrically conductive layer; and an electrically conductive die-attach material for directly attaching a backside surface of the bare integrated circuit die to the externally accessible localized die-attach region on the surface of the first electrically conductive layer to conduct the substrate bias voltage from the first electrically conductive layer to the backside surface of the die.

* * * * *

UNITED STATES PATENT AND TRADEMARK OFFICE
CERTIFICATE OF CORRECTION

PATENT NO. : 6,339,256 B2  Page 1 of 1
APPLICATION NO. : 09/225278
DATED : January 15, 2002
INVENTOR(S) : Salman Akram It is certified that error appears in the above-identified patent and that said Letters Patent is hereby corrected as shown below:

On the title page:
In ITEM (62) "Related U.S. Application Data,"   LINE 2,   after "1997" insert --, now Pat. No. 6,064,116--

Signed and Sealed this

Eighteenth Day of September, 2007

JON W. DUDAS
*Director of the United States Patent and Trademark Office*